(12) United States Patent
Kanou

(10) Patent No.: US 9,597,754 B2
(45) Date of Patent: Mar. 21, 2017

(54) COPPER OR COPPER ALLOY, BONDING WIRE, METHOD OF PRODUCING THE COPPER, METHOD OF PRODUCING THE COPPER ALLOY, AND METHOD OF PRODUCING THE BONDING WIRE

(75) Inventor: Gaku Kanou, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 313 days.

(21) Appl. No.: 14/000,886

(22) PCT Filed: Feb. 15, 2012

(86) PCT No.: PCT/JP2012/053524
§ 371 (c)(1),
(2), (4) Date: Sep. 27, 2013

(87) PCT Pub. No.: WO2012/120982
PCT Pub. Date: Sep. 13, 2012

(65) Prior Publication Data
US 2014/0010705 A1 Jan. 9, 2014

(30) Foreign Application Priority Data

Mar. 7, 2011 (JP) .................................. 2011-049645

(51) Int. Cl.
*B23K 35/30* (2006.01)
*C22C 9/00* (2006.01)
(Continued)

(52) U.S. Cl.
CPC .............. *B23K 35/302* (2013.01); *C22C 9/00* (2013.01); *C22C 9/08* (2013.01); *C25C 1/12* (2013.01);
(Continued)

(58) Field of Classification Search
CPC ............ B23K 35/302; C25C 1/12; C22C 9/00
See application file for complete search history.

(56) References Cited

U.S. PATENT DOCUMENTS 3,389,064 A * 6/1968 Schloen et al. ................ 205/575
4,726,859 A * 2/1988 Hosoda et al. ................. 148/432
(Continued)

FOREIGN PATENT DOCUMENTS

EP 0283587 A1 9/1988
JP 59-64790 A 4/1984
(Continued)

OTHER PUBLICATIONS

Kentaro Shima, "Ko Jundo Kinzoku no Seizo to Oyo (trade edition 1st print)", Kabushiki Kaisha CMC, p. 36, Dec. 2000.
(Continued)

*Primary Examiner* — Jessee Roe
*Assistant Examiner* — John Hevey
(74) *Attorney, Agent, or Firm* — Howson & Howson, LLP

(57) ABSTRACT

Copper or a copper alloy characterized in having an α-ray emission of 0.001 cph/cm$^2$ or less. Since recent semiconductor devices are produced to have higher density and higher capacity, there is greater risk of soft errors caused by the influence of α rays emitted from materials positioned near semiconductor chips. In particular, there are strong demands for achieving higher purification of copper and copper alloys which are used near the semiconductor device, such as copper or copper alloy wiring lines, copper or copper alloy bonding wires, and soldering materials, and materials reduced in α-ray emission are also demanded. Thus, the present invention elucidates the phenomenon in which α rays are emitted from copper or copper alloys, and provides copper or copper alloy reduced in α-ray emission which is
(Continued)

adaptable to the demanded material, and a bonding wire in which such copper or copper alloy is used as its raw material.

14 Claims, 4 Drawing Sheets

(51) Int. Cl.
    *C25C 1/12*         (2006.01)
    *C22C 9/08*         (2006.01)
    *H01L 23/00*       (2006.01)

(52) U.S. Cl.
    CPC ............. *H01L 24/43* (2013.01); *H01L 24/45* (2013.01); *H01L 2224/43* (2013.01); *H01L 2224/45015* (2013.01); *H01L 2224/45147* (2013.01); *H01L 2924/00014* (2013.01); *H01L 2924/014* (2013.01); *H01L 2924/01006* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/01033* (2013.01); *H01L 2924/01047* (2013.01); *H01L 2924/01082* (2013.01); *H01L 2924/10253* (2013.01)

(56) References Cited

U.S. PATENT DOCUMENTS

| | | | |
|---|---|---|---|
| 6,197,433 | B1 | 3/2001 | Hatano |
| 6,444,112 | B1* | 9/2002 | Imada ..................... C25D 1/04 205/586 |
| 6,451,135 | B1 | 9/2002 | Takahashi et al. |
| 6,896,788 | B2* | 5/2005 | Shindo et al. ................ 205/560 |
| 7,435,325 | B2* | 10/2008 | Shindo et al. ................ 205/596 |
| 8,192,596 | B2 | 6/2012 | Shindo et al. |
| 8,216,442 | B2 | 7/2012 | Shindo et al. |
| 2002/0168538 | A1* | 11/2002 | Ellis ......................... C22C 5/02 428/567 |
| 2005/0067291 | A1 | 3/2005 | Haiki et al. |
| 2009/0098012 | A1* | 4/2009 | Shindo et al. ................ 420/559 |
| 2009/0272466 | A1 | 11/2009 | Shindo et al. |
| 2011/0033369 | A1* | 2/2011 | Shindo ..................... C01G 3/10 423/557 |
| 2011/0123389 | A1 | 5/2011 | Shindo et al. |
| 2011/0163447 | A1 | 7/2011 | Fukushima et al. |
| 2013/0028786 | A1 | 1/2013 | Kanou |
| 2013/0302205 | A1 | 11/2013 | Shindo et al. |
| 2014/0332404 | A1 | 11/2014 | Shindo et al. |

FOREIGN PATENT DOCUMENTS

| | | |
|---|---|---|
| JP | 59-64791 A | 4/1984 |
| JP | S60-244054 A | 12/1985 |
| JP | 61-76636 A | 4/1986 |
| JP | 62-2645 A | 1/1987 |
| JP | 62-214145 A | 9/1987 |
| JP | 63-34934 A | 2/1988 |
| JP | S63-073588 A | 4/1988 |
| JP | H01-283398 A | 11/1989 |
| JP | 02-228487 A | 9/1990 |
| JP | 05-077087 A | 3/1993 |
| JP | 06-182580 A | 7/1994 |
| JP | H07-300668 A | 11/1995 |
| JP | 08-023050 A | 1/1996 |
| JP | 09-260427 A | 10/1997 |
| JP | 11-80852 A | 3/1999 |
| JP | 11-343590 A | 12/1999 |
| JP | 2001-271159 A | 10/2001 |
| JP | 2004-043946 A | 2/2004 |
| JP | 2005-175089 A | 6/2005 |
| JP | 2008-202104 A | 9/2008 |
| JP | 2010-171235 A | 8/2010 |

OTHER PUBLICATIONS

Yasuhiko Miyake, "Recent Aspects on Manufacturing Methods and Applications of Super Pure Copper for Industrial Use", Bulletin of the Japan Institute of Metals, vol. 31, No. 4, pp. 267-276, 1992 (month unknown).

Patent Abstracts of Japan, English Abstract of JP 01-283398 A, Nov. 14, 1989.

English Abstract of JP 63-73588 A, Apr. 4, 1988.

\* cited by examiner

COPPER OR COPPER ALLOY, BONDING WIRE, METHOD OF PRODUCING THE COPPER, METHOD OF PRODUCING THE COPPER ALLOY, AND METHOD OF PRODUCING THE BONDING WIRE

BACKGROUND

The present invention relates to copper or a copper alloy reduced in α-ray emission and a bonding wire obtained by using, as its raw material, the foregoing copper or copper alloy which is used in the production of semiconductors.

Generally speaking, copper is a material that is used for the production of semiconductors, and is particularly the main raw material of copper or copper alloy wiring lines, copper or copper alloy bonding wires, and soldering materials. Upon producing a semiconductor device, copper or copper alloy wiring lines, copper or copper alloy bonding wires, and soldering (Cu—Ag—Sn) materials are used for bonding or sealing Si chips of IC or LSI to a lead frame or a ceramic package, during TAB (tape automated bonding) or for forming a bump upon producing a flip chip, or as a wiring material for semiconductors.

Recent semiconductor devices have high densification and lower operating voltage and cell capacity, and there is greater risk of soft errors caused by the influence of α rays emitted from materials positioned near semiconductor chips. Thus, there are demands for achieving higher purification of copper and copper alloys, and materials reduced in α-ray emission are also demanded.

While these are about a different material from the present invention, there are several disclosures related to the reduction of α rays; that is, disclosures related to the technology for reducing α rays from tin. These are introduced below.

Patent Document 1 describes a method of producing low α-ray tin by alloying tin and lead having an α-ray emission of 10 cph/cm$^2$ or less, and thereafter eliminating the lead contained in the tin via refining. The object of this technology is to reduce the α-ray emission by diluting the $^{210}$Pb in the tin by adding high-purity Pb.

Nevertheless, in the foregoing case, a complex process of adding Pb in the tin and thereafter eliminating Pb is required. While a numerical value showing a considerable decrease in the α-ray emission is indicated 3 years after the tin is refined, this can also mean that this tin reduced in α-ray emission cannot be used until after the lapse of 3 years, and therefore it cannot be said that this is an industrially efficient method.

Patent Document 2 describes that the radiation α particle count can be reduced to 0.5 cph/cm$^2$ or less when 10 to 5000 ppm of a material selected from Na, Sr, K, Cr, Nb, Mn, V, Ta, Si, Zr, and Ba is added to a Sn—Pb alloy solder.

Nevertheless, even with the addition of the foregoing materials, the radiation α particle count could only be reduced to a level of 0.015 cph/cm$^2$, and this is not a level that is promising as today's semiconductor device material.

An additional problem is that elements such as alkali metal elements, transition metal elements and heavy metal elements, which are undesirable to get mixed into the semiconductor, are being used. Accordingly, there is no choice but to say that this is a low-level material as a material for use in the assembly of a semiconductor device.

Patent Document 3 describes reducing the count of radiation α particles, which are emitted from the ultrafine solder wires, to be 0.5 cph/cm$^2$ or less, and using such solder wires as the connection wiring lines of a semiconductor device. Nevertheless, with this level of the radiation α particle count, this is not a level that is promising as today's semiconductor device material.

Patent Document 4 describes that it is possible to obtain high-purity tin with a low lead concentration and in which the α-ray count of lead is 0.005 cph/cm$^2$ or less by using, as the electrolytic solution, highly refined sulfuric acid and hydrochloric acid such as high-grade sulfuric acid and high-grade hydrochloric acid, and performing electrolysis by using the high-purity tin as the positive electrode. If high-purity raw materials (reagents) are used by disregarding costs, it goes without saying that high-purity materials can be obtained. Even still, the lowest α-ray count of the deposited tin indicated in the Examples of Patent Document 4 is 0.002 cph/cm$^2$, and this is not a promising level considering the high cost.

Patent Document 5 describes a method of obtaining metal tin of 5N or higher by adding nitric acid to a heated aqueous solution doped with crude metal tin so as to precipitate metastannic acid, filtering and washing the metastannic acid, dissolving the cleaned metastannic acid with hydrochloric acid or hydrofluoric acid, and using the obtained solution as the electrolytic solution to perform electrowinning. While this technology vaguely describes its application to use in semiconductor device, Patent Document 5 makes no particular reference to the limitation on radioactive elements and the radiation α particle count, and it could be said that Patent Document 5 does not have much interest in these issues.

Patent Document 6 describes technology of reducing the amount of Pb contained in Sn configuring the solder alloy, and using Bi or Sb, Ag, Zn as the alloy material. Nevertheless, in the foregoing case, even if Pb is reduced as much as possible, Patent Document 6 fails to specifically indicate a means for fundamentally resolving the problem of the radiation α particle count caused by Pb that naturally gets mixed in.

Patent Document 7 discloses tin having a grade of 99.99% or higher and in which the radiation α particle count is 0.03 cph/cm$^2$ or less produced by using a high-grade sulfuric acid reagent and performing electrolysis. In this case also, if high-purity raw materials (reagents) are used by disregarding costs, it goes without saying that high-purity materials can be obtained. Even still, the lowest α-ray count of the deposited tin indicated in the Examples of Patent Document 7 is 0.003 cph/cm$^2$, and this is not a promising level considering the high cost.

Patent Document 8 describes lead, as a brazing filler material for use in semiconductor devices, having a grade of 4N or higher, a radioisotope of less than 50 ppm, and a radiation α particle count of 0.5 cph/cm$^2$ or less. Moreover, Patent Document 9 describes tin, as a brazing filler material for use in semiconductor devices, having a grade of 99.95% or higher, a radioisotope of less than 30 ppm, and a radiation α particle count of 0.2 cph/cm$^2$ or less.

The toleration level of the radiation α particle count in all of these Patent Documents is lenient, and there is a problem in that they are not of a level that is promising as today's semiconductor device material.

In light of the foregoing circumstances, the present applicant proposed, as described in Patent Document 10, eliminating the influence of the α rays on semiconductor chips by using high-purity tin; that is, tin having a purity of 5N or higher (provided that the gas components of O, C, N, H, S and P are excluded), and particularly causing the respective contents of U and Th, which are radioactive elements, to be 5 ppb or less, and the respective contents of Pb and Bi, which emit radiation α particles, to be 1 ppm or less. In the foregoing case, the high-purity tin is ultimately produced by being subject to melting/casting, and rolling/cutting as needed, and this technology can cause the α-ray count of the high-purity tin to be 0.001 cph/cm² or less.

Upon refining Sn, Po has extremely high sublimability, and when heated in the production process; for instance, during the melting/casting process, Po becomes sublimated. It is considered that, if the isotope $^{210}$Po of polonium is eliminated in the initial stages of the production process, the decay from the isotope $^{210}$Po of polonium to the isotope $^{206}$Pb of lead will not occur, which in turn will not cause the generation of α rays.

This is because the generation of α rays during the production process was considered to occur during the decay from the $^{210}$Po to the isotope $^{206}$Pb of lead. Nevertheless, in reality, even though it was considered that Po had been nearly eliminated during the production process, the generation of α rays continued to occur. Accordingly, it could not be said that the fundamental problem could be resolved merely by reducing the α-ray count of the high-purity tin during the initial stages of the production process.

While the foregoing Patent Documents are mainly related to the α rays of tin, copper or copper alloy is used as a wiring line material of LSI and a bonding wire for connecting the chip and lead frame in semiconductors. Since bonding wires are placed at a distance from the memory portion which causes soft errors, not much consideration was given to the α-rays amount that is emitted from the wires, and a level of 0.5 cph/cm² or less was considered to be sufficient (refer to paragraph 0004 of Patent Document 11).

While there are some other Patent Documents related to copper or copper alloy bonding wires, none of them offer any disclosure related to the α-ray emission. Patent Documents related to copper or copper alloy bonding wires are listed below and briefly described.

Patent Document 12 describes a method of producing high-purity copper for a bonding wire of a semiconductor device, and describes improving the Vickers hardness, elongation and breaking strength by causing the total content of unavoidable impurities to be 5 ppm or less, and causing the contents of S, Se and Te contents among the unavoidable impurities to be respectively 0.5 ppm or less, 0.2 ppm or less, and 0.2 ppm or less.

Patent Document 13 describes, as a method of producing a copper material for a bonding wire, a refining process of electrolytic refining→vacuum melting→floating zone technique.

Patent Document 14 describes a bonding wire containing Fe, P, and In, and at least one type among Sn, Pb and Sb.

Patent Document 15 describes a method of producing a bonding wire material with an adjusted solidification rate as the method of producing a bonding wire material for a semiconductor element.

Patent Document 16 describes a bending-resistant copper alloy having high strength and high electric conductivity for a conducting wire or a cable, and further describes that the copper alloy contains Fe, P, and two types selected among In, Sn, Pb and Sb, and further contains Zr.

Patent Document 17 describes a copper alloy having high thermal resistance and high electric conductivity, and further describes that the copper alloy contains Fe and P, two types selected among In, Sn, Pb and Sb, and Zr.

In addition, as the copper refining method, Patent Document 18 describes technology of separating the anode and the cathode with a diaphragm, extracting the Cu ion-containing electrolytic solution eluted from the anode, and passing the electrolytic solution through an active carbon filter with an aperture of roughly 0.1 μm immediately before placing the electrolytic solution in the cathode box; Patent Document 19 describes technology, on the premise of achieving higher purification based on electrowinning or electrolytic refining, eliminating impurities from the anolite of the copper-containing solution based on acid and active carbon treatment, and using the high-purity copper solution, from which impurities have been eliminated, as the catholite; and Patent Document 20 describes technology of using a diaphragm cell in which a positive electrode (anode) chamber and a negative electrode (cathode) chamber are separated by a diaphragm, using a chalcopyrite leaching solution as the electrolytic solution in a chlorine bath and supplying the chalcopyrite leaching solution to the cathode chamber, and collecting electrolytic copper on the cathode surface based on electrolytic reduction.

Nevertheless, none of the foregoing copper refining methods disclose technology of reducing α rays.

Patent Document 1: Japanese Patent No. 3528532
Patent Document 2: Japanese Patent No. 3227851
Patent Document 3: Japanese Patent No. 2913908
Patent Document 4: Japanese Patent No. 2754030
Patent Document 5: JP H11-343590A
Patent Document 6: JP H9-260427 A
Patent Document 7: JP H1-283398 A
Patent Document 8: Japanese Patent No. S62-47955
Patent Document 9: Japanese Patent No. S62-1478
Patent Document 10: WO2007-004394
Patent Document 11: JP 2005-175089 A
Patent Document 12: Japanese Patent No. H7-36431
Patent Document 13: Japanese Patent No. H8-23050
Patent Document 14: Japanese Patent No. S62-56218
Patent Document 15: JP S63-34934 A
Patent Document 16: JP S62-214145 A
Patent Document 17: JP S61-76636 A
Patent Document 18: Japanese Patent No. 4620185
Patent Document 19: Japanese Patent No. 4519775
Patent Document 20: JP 2005-105351 A

SUMMARY OF INVENTION

Technical Problem

Recent semiconductor devices have high densification and lower operating voltage and cell capacity and there is greater risk of soft errors caused by the influence of α rays emitted from materials positioned near semiconductor chips. In particular, there are strong demands for achieving higher purification of copper and copper alloys which are used near the semiconductor device, such as copper or copper alloy wiring lines, copper or copper alloy bonding wires, and soldering materials, and materials reduced in α-ray emission are also demanded. Thus, an object of the present invention is to elucidate the phenomenon in which α rays are emitted from copper or copper alloys, and provide copper or copper alloy reduced in α-ray emission which is adaptable to the demanded material, and a bonding wire in which such copper or copper alloy is used as its raw material.

Solution to Problem

The following invention is provided in order to resolve the foregoing problems.

1) Copper or a copper alloy, wherein an α-ray emission of a sample after being subject to melting/casting is 0.001 cph/cm² or less.

2) Copper or a copper alloy, wherein respective α-ray emissions of samples 1 week after, 3 weeks after, 1 month after, 2 months after, 6 months after and 30 months after the melting/casting are 0.001 cph/cm$^2$ or less.

3) The copper or copper alloy according to 1) or 2) above, wherein the purity is 4N (99.99%) or higher.

In the case of copper alloy, the purity includes Cu as the base and additive elements.

4) The copper or copper alloy according to any one of 1) to 3) above, wherein Pb content is 0.1 ppm or less.

5) A bonding wire obtained by using, as its raw material, the copper or copper alloy according to any one of 1) to 4) above.

Effects of Invention

While recent semiconductor devices have high densification and lower operating voltage and cell capacity and there is greater risk of soft errors caused by the influence of α rays emitted from materials positioned near semiconductor chips, the present invention yields a superior effect of being able to provide copper or a copper alloy which is adaptable to materials reduced in α rays and a bonding wire which uses such copper or copper alloy as its raw material. It is thereby possible to considerably reduce the occurrence of soft errors in the semiconductor device caused by the influence of α-ray emission.

DETAILED DESCRIPTION

While there are numerous radioactive elements that generate α rays, many of them have an extremely long half-life or an extremely short half-life, and in reality do not cause problems. What are problematic are the α rays that are generated in the U decay chain (refer to FIG. 1) during the decay from the isotope $^{210}$Po of polonium to the isotope $^{206}$Pb of lead.

With copper or copper alloy wiring lines, copper or copper alloy bonding wires, and soldering materials that are used near the semiconductor device, materials have been developed in which copper or copper alloy is used as the raw material, and a low α-ray copper or copper alloy material is being demanded.

For example, oxygen-free copper of 4N to 5N is normally used as the raw material of a copper or copper alloy bonding wire, and contains lead in an amount of 0.1 wtppm or more, and the generation of α rays also exceeds 0.001 cph/cm$^2$. Moreover, conventionally, since it was considered that low α-rays were not even required, it could be said that there was no motive for reducing the α rays.

As described above, Po has extremely high sublimability, and when heated in the production process; for instance, during the melting/casting process, Po becomes sublimated.

Figure 1:
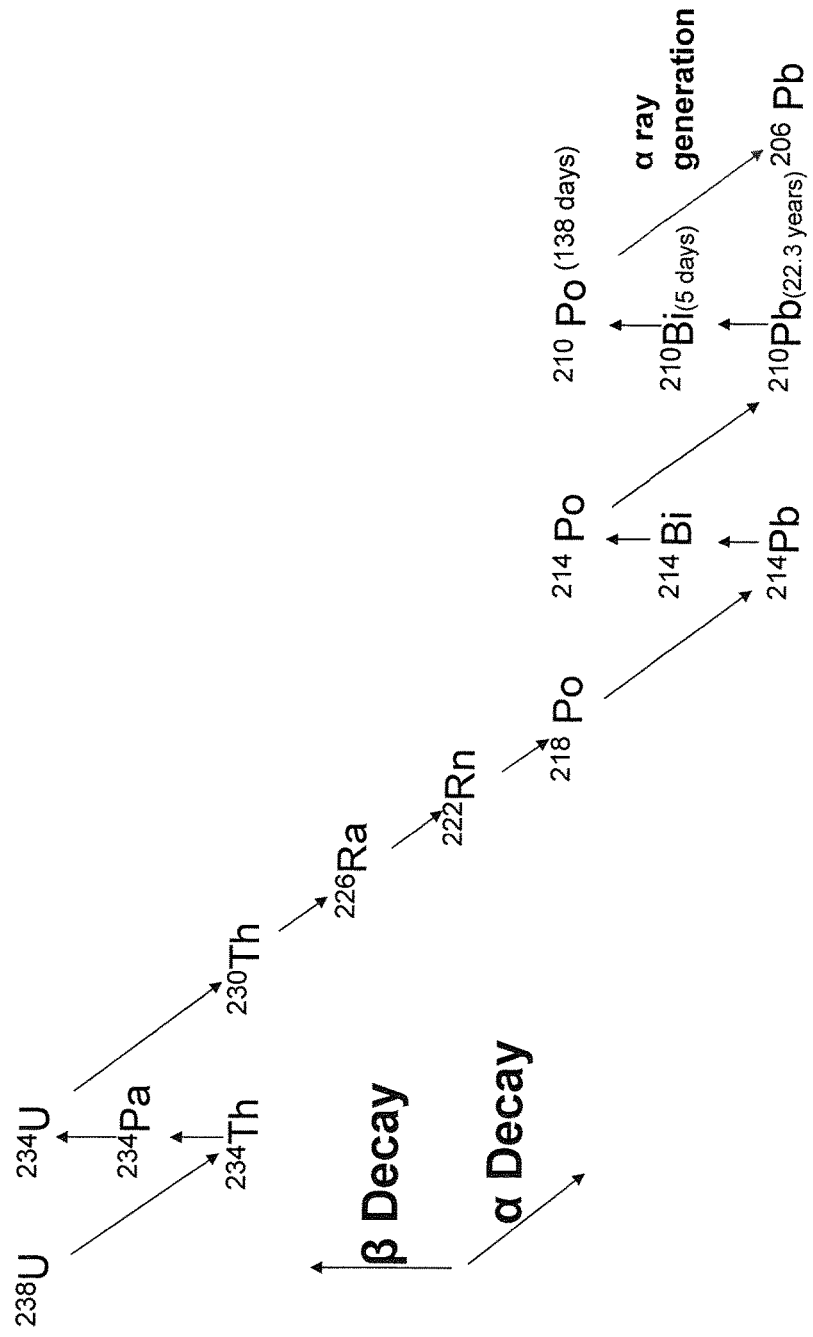
FIG. 1 This is a diagram showing the decay chain (uranium/radium decay chain) from the decay of uranium (U) to reaching $^{206}$Pb.

It is considered that, if the isotope $^{210}$Po of polonium is eliminated in the production process, the decay from the isotope $^{210}$Po of polonium to the isotope $^{206}$Pb of lead will not occur, which in turn will not cause the generation of α rays (refer to "U decay chain" of FIG. 1).

Figure 2:
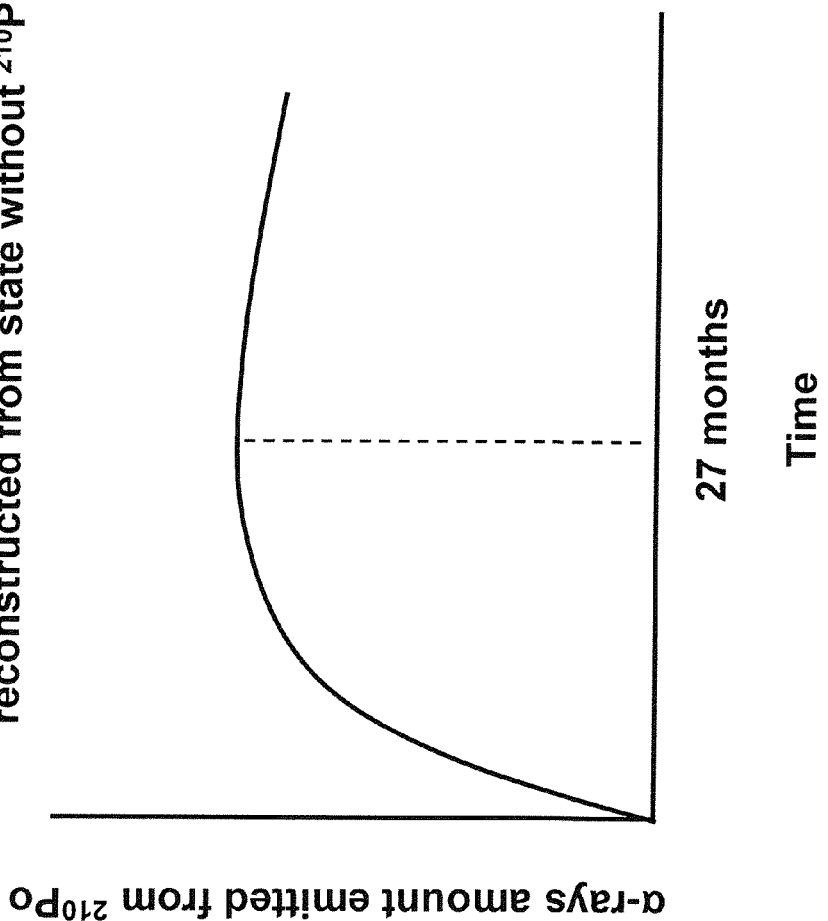
FIG. 2 This is a diagram showing the α-rays amount that is emitted when the decay chain of $^{210}$Pb→$^{210}$Bi→$^{210}$Po→$^{206}$Pb is reconstructed from a state without hardly any isotope $^{210}$Po of polonium.

Nevertheless, in a state where there is hardly any isotope $^{210}$Po of polonium, decay of $^{210}$Pb→$^{210}$Bi→$^{210}$Po→$^{206}$Pb will occur. In addition, it has been confirmed that it takes approximately 27 months (little over 2 years) for this decay chain to become an equilibrium state (refer to FIG. 2).

In other words, when the isotope $^{206}$Pb of lead (half-life of 22 years) is contained in the copper material, decay of $^{210}$Pb→$^{210}$Bi (half-life of 5 days)→$^{210}$Po (half-life of 138 days) will advance pursuant to the lapse of time, and $^{210}$Po is generated as a result of the decay chain being reconstructed. Thus, α rays caused by the decay from the isotope $^{210}$Po of polonium to the isotope $^{206}$Pb of lead are generated.

Accordingly, the problem cannot be resolved even if the α-ray emission is low immediately after the product is produced, and there is a problem in that the α-ray emission gradually increases with the lapse of time, and the risk of soft errors will increase. The foregoing period of 27 months (little over 2 years) is not necessary a short period of time.

The problem of the α-ray emission gradually increasing with the lapse of time even if the α-ray emission is low immediately after the product is produced is a result of the isotope $^{210}$Pb of lead of the U decay chain shown in FIG. 1 being contained in the material, and it could be said that the foregoing problem cannot be resolved unless the content of the isotope $^{210}$Pb of lead is reduced as much as possible.

Figure 3:
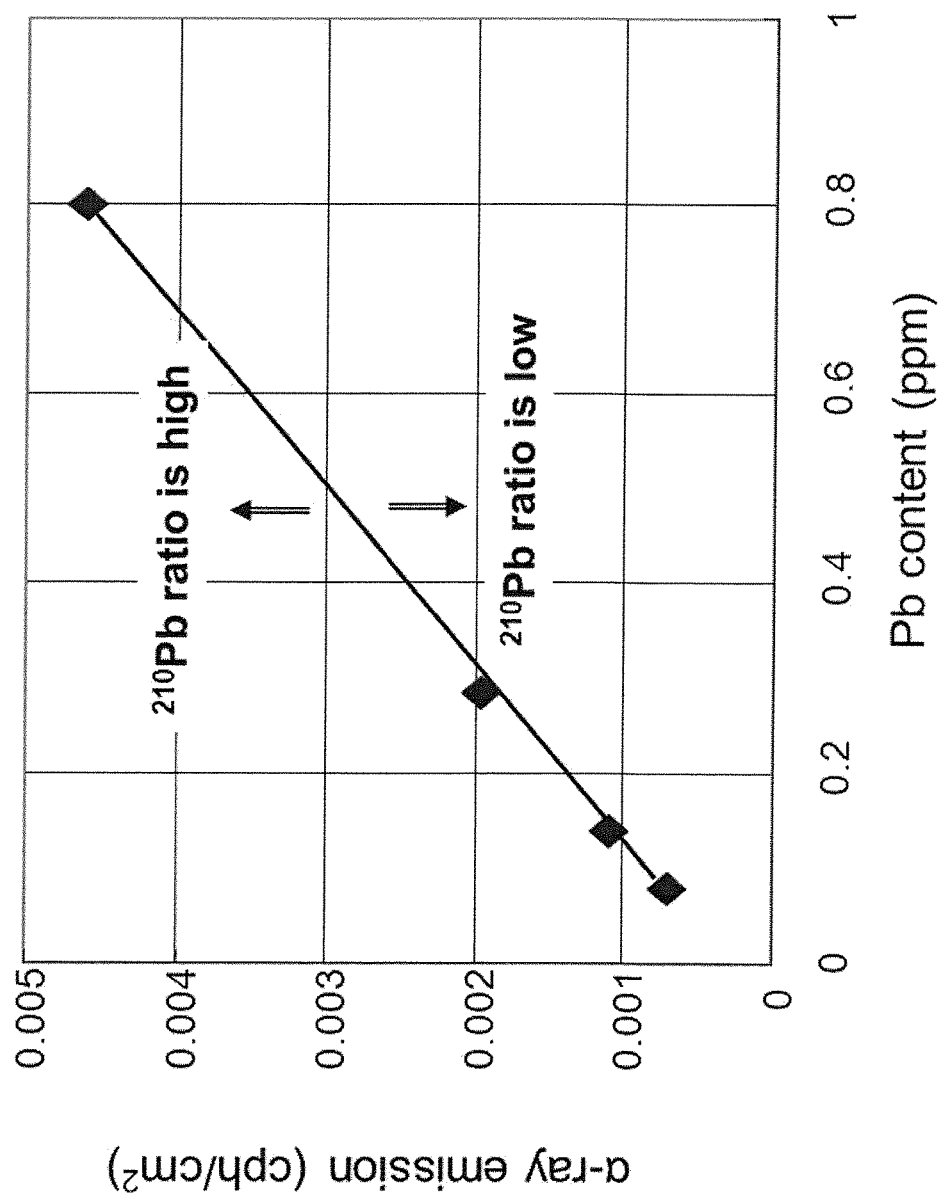
FIG. 3 This is a diagram showing the relation of Pb content in Cu and α-ray emission.
Figure 4:
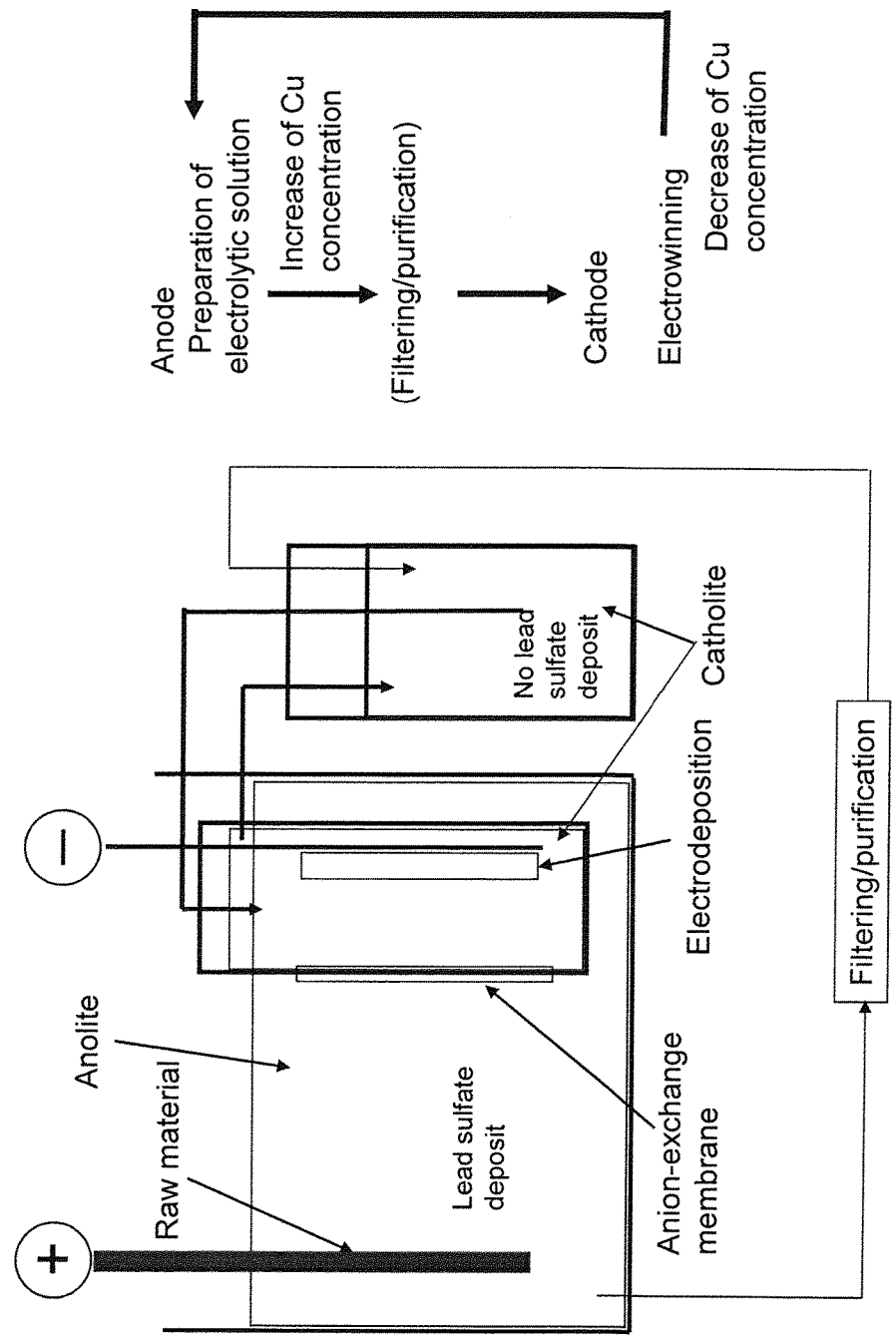
FIG. 4 This is a diagram schematically showing the lead removal process based on diaphragm electrolysis.

FIG. 3 shows the relation of the Pb content in Cu and the α-ray emission. The straight line shown in FIG. 3 shifts up and down depending on the ratio of the isotope $^{214}$Pb, $^{210}$Pb, $^{209}$Pb, $^{208}$Pb, $^{207}$Pb, $^{206}$Pb, $^{204}$Pb of lead, and it has been confirmed that the straight line shifts more upward as the ratio of the isotope $^{210}$Pb of lead is greater.

Accordingly, it is important to reduce the ratio of the isotope $^{210}$Pb of lead in the copper, and, since the isotope $^{210}$Pb of lead can also be reduced by reducing Pb to be 0.1 ppm or less, the α-ray emission will not increase with the lapse of time.

Moreover, the abundance ratio of the isotope $^{206}$Pb of lead being small means that the ratio of the U decay chain shown in FIG. 1 is relatively small, and it is considered that the isotope $^{210}$Pb of lead belonging to this system will also decrease.

The α-ray emission of copper that was subject to melting/casting can consequently achieve 0.001 cph/cm$^2$ or less. To achieve an α-ray emission of the foregoing level is the basis of the present invention, and it could be said that the conventional technologies do not disclose or even suggest the foregoing achievement based on the foregoing recognition.

Specifically, provided is copper or a copper alloy having an α-ray emission of 0.001 cph/cm$^2$ or less in all cases; namely, 1 week after, 3 weeks after, 1 month after, 2 months after, and 6 months after the melting/casting, and 30 months, which is over 27 months after the melting/casting until when the decay chain of $^{210}$Pb→$^{210}$Bi→$^{210}$Po→$^{206}$Pb becomes equilibrium in a state where there is no isotope $^{210}$Po of polonium which generates α rays caused by the decay to the isotope $^{206}$Pb of lead.

Note that, with a hydrochloric acid bath that is used in the electrolytic refining for low pregelatinization (reduction of α-ray emission) of tin and the like, since Pb is not deposited, Pb cannot be eliminated with the diaphragm electrolysis of the present case. Moreover, while a nitric acid bath is also used in the electrolytic refining of Cu, since Pb is also not deposited in the foregoing case, Pb cannot be eliminated with the diaphragm electrolysis of the present case. In the present case, Pb is eliminated based on diaphragm electrolysis as a result of causing Pb to be deposited, and low pregelatinization (reduction of α-ray emission) is thereby achieved.

In addition, caution is required upon measuring the α-ray emission. This is because α rays (hereinafter referred to as "background (BG) α rays" as needed) are sometimes output from the α-ray measuring device (equipment). The foregoing α-ray emission in the present invention is the substantial α-ray emission that does not include the α rays output from the α-ray measuring device. Thus, the term "α-ray emission" as used in this specification shall be used in the foregoing meaning.

While the α-ray emission that is emitted from copper or copper alloy was explained above, alloys containing copper or copper alloy are also strongly affected by the α-ray emission. While the influence of the α-ray emission is sometimes mitigated by components other than copper in which the α-ray emission is small or hardly occurs, with regard to a copper alloy in which 40% or more of copper is at least contained in the alloy component, it would be desirable to use the copper with low α-ray emission according to the present invention.

The refining of copper is performed based on the diaphragm electrolysis described below.

A copper sulfate solution is used as an electrolytic solution, a diaphragm is provided between a positive electrode and a negative electrode, deposits, particularly lead sulfate, in the electrolytic solution extracted from the positive electrode side are removed, and the electrolytic solution is thereafter supplied to the negative electrode side.

The diaphragm electrolysis of the present invention is unique in that a copper sulfate solution (for instance, Cu concentration of 30 to 200 g/L) is used, and an anion-exchange membrane, through which $Pb^{2+}$ ions do not pass, is used as the diaphragm. Even if diaphragm electrolysis is performed, when a cation-exchange membrane is used, $Pb^{2+}$ ions will pass therethrough, and lead will get mixed into the electrodeposited copper on the cathode side. Thus, as described above, it is necessary to use an anion-exchange membrane. Moreover, elimination of the lead sulfate as the deposits from the electrolytic solution is performed via filtration using a filter.

As described above, the present invention can eliminate lead to a level of 0.1 ppm by performing diaphragm electrolysis of using an anion-exchange membrane and using a copper sulfate solution as the electrolytic solution. The copper or copper alloy of the present invention obtained as described above yields a superior effect of being able to considerably reduce the occurrence of soft errors in the semiconductor device caused by the influence of α-ray emission.

Note that, as described above, while diaphragm electrolysis of using an anion-exchange membrane and using a copper sulfate solution as the electrolytic solution is an effective method, it should be easy to understand that the present invention is not limited to this method so as long as the production method can achieve an α-ray emission of 0.001 $cph/cm^2$ or less.

EXAMPLES

Examples of the present invention are now explained. Note that these Examples are merely illustrative, and the present invention is not limited to these Examples. In other words, the present invention covers all modes or modifications other than the following Examples within the scope of the technical concept of the present invention.

Example 1

Crude copper (purity of approximately 99%) after being refined in a revolving furnace in the copper refining process was used as a raw material anode, and electrolytic refining was performed using a copper sulfate solution. Since the lead contained in the crude copper is deposited as lead sulfate, diaphragm electrolysis using an anion-exchange membrane was performed in order to prevent the deposits from getting caught in the electrodeposit.

The crude copper was subject to electrodissolution using the positive electrode, the resulting solution of a predetermined copper concentration was extracted with a pump and filtered, and the solution, which is free of deposits, was delivered to the negative electrode to obtain an electrodeposit. Consequently, a copper electrodeposit having a purity of 4N with a low lead concentration was obtained. The contents of Pb, U, and Th were respectively <0.01 wtppm, <5 wtppb, and <5 wtppb.

The collected electrodeposited copper was washed and dried, subject to melting/casting at a temperature of 1200° C., and the time-dependent change of the α-ray emission from immediately after the melting/casting was checked. The sample to be subject to α-ray measurement was obtained by rolling a plate that was subject to melting/casting to a thickness of approximately 1.5 mm, and cut out into a plate of 310 mm×310 mm. The surface area thereof is 961 $cm^2$. The obtained plate was used as the sample to be subject to α-ray measurement.

As the α-ray measuring device, the Gas Flow Proportional Counter Model 8600A-LB manufactured by Ordela was used. The used gas was 90% argon and 10% methane, the measurement time was 104 hours for both the background and sample, and the first 4 hours were the hours required for purging the measurement chamber, and the measurement was performed from 5 hours after to 104 hours after. In other words, used for the calculation of the α-ray emission was data from 5 hours after to 104 hours after of samples 1 week after, 3 weeks after, 1 month after, 2 months after, and 6 months after the melting/casting.

With regard to the foregoing samples, as a result of measuring the α-ray emission 1 week after, 3 weeks after, 1 month after, 2 months after, and 6 months after the melting/casting, and 30 months, which is over 27 months after the melting/casting until when the decay chain of $^{210}Pb \rightarrow {}^{210}Bi \rightarrow {}^{210}Po \rightarrow {}^{206}Pb$ becomes equilibrium in a state where there is no isotope $^{210}Po$ of polonium which generates α rays caused by the decay to the isotope $^{206}Pb$ of lead, the α-ray emission was, at maximum, 0.001 $cph/cm^2$, and satisfied the conditions of the present invention.

Moreover, when producing a copper alloy ingot, as the alloy elements to be added, normally several 10 to several 100 wtppm of one or more types selected from Al, Ag, B, Ba, Be, Bi, Ca, Ce, Co, Cr, Dy, Eu, Gd, Ge, In, Ir, La, Mg, Mo, Nd, Ni, P, Pd, Pt, Rh, Ru, Sb, Si, Sn, Sr, Y, Ti, Yb, Zn, and Zr are added.

Upon producing this copper alloy, it is important to cause the contents of Pb, U, and Th contained in the copper alloy, which contains Cu as the base, to be respectively <0.01 wtppm, <5 wtppb, and <5 wtppb when performing the melting/casting process. In this Example, as a result of similarly measuring the α-ray emission upon producing the foregoing copper alloy, the α-ray emission was also, at maximum, 0.001 cph/cm².

Comparative Example 1

Commercially available oxygen-free copper was subject to melting/casting, and an α-ray sample was prepared with the same method as Example 1. The contents of Pb, U, and Th were respectively 1 wtppm, <5 wtppb, and <5 wtppb.

As a result of checking the time-dependent change of the α-ray emission from immediately after the melting/casting process, the α-ray emission was 0.001 cph/cm² or less immediately after the melting/casting process, but gradually increased. This is considered to be because, while the α-ray emission had temporarily decreased since Po evaporated in the melting/casting process, since Pb is contained in an amount of 1 wtppm, the decay chain was constructed once again and the α-ray emission had consequently increased. It was hence not possible to achieve the object of the present invention.

Comparative Example 2

Crude copper (purity of approximately 99%) after being refined in a revolving furnace in the copper refining process was used as a raw material anode, and electrolytic refining was performed using a copper sulfate solution without using a diaphragm. Consequently, the contents of Pb, U, and Th were respectively 0.2 wtppm, <5 wtppb, and <5 wtppb.

As a result of checking the time-dependent change of the α-ray emission from immediately after the melting/casting process, the α-ray emission was 0.001 cph/cm² or less immediately after the melting/casting process, but gradually increased. This is considered to be because, while the α-ray emission had temporarily decreased since Po evaporated in the melting/casting process, since Pb is contained in an amount of 0.2 wtppm, the decay chain was constructed once again and the α-ray emission had consequently increased. It was hence not possible to achieve the object of the present invention.

Example 2

The copper ingot prepared with the method of Example 1 was subject to wire drawing processing to obtain a wire having a diameter of 25 μm. As a result of covering a sample tray of the α-ray measuring device with the prepared wires and performing a measurement with the same method as Example 1, the α-ray emission did not increase and was stably 0.001 cph/cm² or less. Accordingly, this processed copper wire can be effectively used as a copper bonding wire.

Moreover, the copper alloy ingot produced in Example 1 doped with several 10 to several 100 wtppm of one or more types selected from Al, Ag, B, Ba, Be, Bi, Ca, Ce, Co, Cr, Dy, Eu, Gd, Ge, In, Ir, La, Mg, Mo, Nd, Ni, P, Pd, Pt, Rh, Ru, Sb, Si, Sn, Sr, Y, Ti, Yb, Zn, and Zr was subject to wire drawing processing, and a result of performing a measurement, the α-ray emission did not increase and was stably 0.001 cph/cm² or less. This means that, careful component adjustment is important in the production stage of the copper alloy, and it is also important to cause the contents of Pb, U, and Th contained in the copper alloy, which contains Cu as the base, to be respectively <0.01 wtppm, <5 wtppb, and <5 wtppb.

Comparative Example 3

The copper ingots prepared with the methods of Comparative Example 1 and Comparative Example 2 was subject to wire drawing processing to obtain wires having a diameter of 25 μm. As a result of covering a sample tray of the α-ray measuring device with the prepared wires and performing a measurement, the α-ray emission was roughly 0.001 cph/cm² immediately after the wire drawing processing, but gradually increased. Accordingly, it cannot be said that the foregoing processed copper wire is an effective material as a copper bonding wire.

As described above, since the present invention yields a superior effect of being able to provide copper or a copper alloy which is adaptable to materials reduced in α rays and a bonding wire which uses such copper or copper alloy as its raw material; it is possible to eliminate the influence of α rays on semiconductor chips as much as possible. Accordingly, the present invention can considerably reduce the occurrence of soft errors in the semiconductor device caused by the influence of α-ray emission, and is useful as a material for locations, in which copper or a copper alloy is used, such as copper or copper alloy wiring lines, copper or copper alloy bonding wires, and soldering materials.

The invention claimed is:

1. A method of producing a copper of low α-ray radiation, comprising the steps of:
   preparing an electrolytic cell comprising a copper sulfate solution as a starting electrolytic solution, a positive electrode and a negative electrode, and a diaphragm positioned in the electrolytic cell to partition the electrolytic cell into a positive electrode side containing the positive electrode and a negative electrode side containing the negative electrode;
   performing electrolysis with the electrolytic cell equipped with a crude copper raw material as the positive electrode to obtain an anolyte solution formed by anodic dissolution of the crude copper raw material;
   extracting and filtering an amount of the anolyte solution to remove lead sulfate precipitates contained in the extracted anolyte solution and to obtain a filtered anolyte solution;
   bringing back the filtered anolyte solution to the negative electrode side of the electrolytic cell and performing electrolysis to form an electrodeposited copper on the negative electrode; and
   collecting the electrodeposited copper from the negative electrode and melting and casting the electrodeposited and collected copper to form the copper of low α-ray radiation;
   wherein the copper of low α-ray radiation has an α-ray count of 0.001 cph/cm² or less at a time after a lapse of 30 months from a time of the melting and casting.

2. A method according to claim 1, wherein the copper sulfate solution has a Cu concentration of 30 to 200 g/L.

3. A method according to claim 2, wherein the diaphragm is an anion-exchange membrane through which $Pb^{2+}$ ions do not pass.

4. A method according to claim 3, wherein the copper of low α-ray radiation has a Pb content of less than 0.01 wtppm, an U content of less than 5 wtppb, and a Th content of less than 5 wtppb.

5. A method according to claim 4, wherein the copper of low α-ray radiation has an α-ray count of 0.001 cph/cm² or less at each time after a lapse of 1 week, 3 weeks, 1 month, 2 months, 6 months, and 30 months from a time of the melting and casting.

6. A method according to claim 5, wherein the copper of low α-ray radiation has a purity of 4N (99.99%) or higher.

7. A method of producing a copper alloy of low α-ray radiation, comprising the steps of providing a copper produced by the method according to claim 6, melting the copper together with one or more of alloying elements to obtain a copper alloy in a molten state, and casting the copper alloy.

8. A method of producing a bonding wire, comprising the step of subjecting the copper alloy produced according to claim 7 to wire drawing processing to form bonding wire.

9. A method according to claim 1, wherein the diaphragm is an anion-exchange membrane through which $Pb^{2+}$ ions do not pass.

10. A method according to claim 1, wherein the copper of low α-ray radiation has a Pb content of less than 0.01 wtppm, an U content of less than 5 wtppb, and a Th content of less than 5 wtppb.

11. A method according to claim 1, wherein the copper of low α-ray radiation has an α-ray count of 0.001 $cph/cm^2$ or less at each time after a lapse of 1 week, 3 weeks, 1 month, 2 months, 6 months, and 30 months from a time of the melting and casting.

12. A method according to claim 1, wherein the copper of low α-ray radiation has a purity of 4N (99.99%) or higher.

13. A method of producing a copper alloy of low α-ray radiation, comprising the steps of providing a copper produced by the method according to claim 1, melting the copper together with one or more of alloying elements to obtain a copper alloy in a molten state, and casting the copper alloy.

14. A method of producing a bonding wire, comprising the step of subjecting the copper alloy produced according to claim 13 to wire drawing processing to form bonding wire.

* * * * *